United States Patent
Tasaka

(10) Patent No.: US 8,247,851 B2
(45) Date of Patent: Aug. 21, 2012

(54) METHOD OF MANUFACTURING SEMICONDUCTOR DEVICE FOR PROVIDING IMPROVED ISOLATION BETWEEN CONTACT AND CELL GATE ELECTRODE

(75) Inventor: Kazuhiro Tasaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 395 days.

(21) Appl. No.: 12/382,725

(22) Filed: Mar. 23, 2009

(65) Prior Publication Data
US 2009/0236641 A1 Sep. 24, 2009

(30) Foreign Application Priority Data
Mar. 24, 2008 (JP) ................................. 2008-076054

(51) Int. Cl.
*H01L 29/43* (2006.01)
(52) U.S. Cl. ................. 257/288; 257/296; 257/E29.139
(58) Field of Classification Search .................. 257/288, 257/296, E21.214
See application file for complete search history.

(56) References Cited

U.S. PATENT DOCUMENTS

| 5,899,720 | A | * | 5/1999 | Mikagi | 438/303 |
| 6,194,757 | B1 | * | 2/2001 | Shinkawata | 257/306 |
| 6,333,222 | B1 | | 12/2001 | Kitazawa et al. | |

FOREIGN PATENT DOCUMENTS

| JP | 5-343669 | 12/1993 |
| JP | 6-21089 | 1/1994 |
| JP | 2000-269458 | 9/2000 |
| JP | 2007-067250 | 3/2007 |
| KR | 2001-0056888 | 7/2001 |

OTHER PUBLICATIONS

Korean Office Action dated Jan. 20, 2011, with English translation.

* cited by examiner

*Primary Examiner* — Zandra Smith
*Assistant Examiner* — Paul Patton
(74) *Attorney, Agent, or Firm* — McGinn IP Law Group, PLLC

(57) ABSTRACT

A manufacture method is provided for forming a semiconductor device. The method includes: forming a plurality of gate electrodes through etching a conductive film deposited on a semiconductor substrate; forming a first nitride film to cover the gate electrodes; partially exposing the semiconductor substrate in a region between adjacent two of the gate electrodes through performing an etch-back process on the first nitride film; thermally oxidizing a residual of the gate electrode film remaining in the region between the adjacent two of the gate electrodes to change the residual into an thermal oxide film; and forming a contact in the region between the adjacent two of the gate electrodes.

11 Claims, 11 Drawing Sheets

116: SHORT-CIRCUITING PORTION
115: N⁺-DOPED SILICON CONTACT

121: BITLINE CONTACT
122: BITLINE
120: CAPACITOR PLATE
119: CAPACITOR DIELECTRIC
118: CAPACITOR ELECTRODE
117: CAPACITOR CONTACT

- 3: GATE OXIDE FILM
- 6: CVD OXIDE FILM
- 5: WSi FILM
- 4: N⁺-DOPED SILICON FILM
- 1: P-TYPE SILICON SUBSTRATE
- 2: ISOLATION OXIDE FILM

- 7: MASK OXIDE FILM

- 8: CELL GATE ELECTRODE
- 9: RESIDUAL MATERIAL
- 10: N-TYPE DIFFUSION LAYER

12: INTERLAYER DIELECTRIC
11: FIRST NITRIDE FILM

13: CELL CONTACT HOLE

14: SIDEWALL

23: THERMAL OXIDE FILM
24: OXIDATION-ENHANCED OXIDE FILM

25: SECOND NITRIDE FILM

27: CAP OXIDE FILM
26: SIDEWALL

15: N⁺-DOPED SILICON CONTACT

21: BITLINE CONTACT
22: BITLINE
20: CAPACITOR PLATE
19: CAPACITOR DIELECTRIC
18: CAPACITOR ELECTRODE
17: CAPACITOR CONTACT

23: THERMAL OXIDE FILM
31: THERMAL OXIDE FILM

25: SECOND NITRIDE FILM

26: SIDEWALL

15: N⁺-DOPED SILICON CONTACT

21: BITLINE CONTACT
22: BITLINE
20: CAPACITOR PLATE
19: CAPACITOR DIELECTRIC
18: CAPACITOR ELECTRODE
17: CAPACITOR CONTACT

METHOD OF MANUFACTURING SEMICONDUCTOR DEVICE FOR PROVIDING IMPROVED ISOLATION BETWEEN CONTACT AND CELL GATE ELECTRODE

INCORPORATION BY REFERENCE

This application claims the benefit of priority based on Japanese Patent Application No. 2008-076054, filed on Mar. 24, 2008, the disclosure of which is incorporated herein by reference.

BACKGROUND OF THE INVENTION

1. Field of the Invention

The present invention relates to a method for manufacturing a semiconductor device, more particularly, to a technique for forming memory cell contacts of a semiconductor memory device such as a DRAM (dynamic random access memory) and a pseudo SRAM (static random access memory).

2. Description of the Related Art

Recently, dimension reduction has been advanced in memory devices, such as DRAMs, which include one transistor and one capacitor in each memory cell, and pseudo SRAMs, which have the same cell structure as that of DRAMs. The dimension reduction provides an increased memory capacity while reducing the chip cost due to the yield increase.

The dimension reduction in the semiconductor memory cell is, however, undesirably accompanied by the difficulty in providing a clearance between the gate electrode and the cell contact within each memory cell. One known approach to address this problem is to use a self-align contact technique in which the cell contact is self-aligned with respect to the gate electrode with the cell contact size adjusted to be equal to the distance between adjacent gate electrodes.

The following is prior art documents found through the Applicant's search related to the present invention:

Japanese Laid Open Patent Application No. JP-A 2000-269458,
Japanese Laid Open Patent Application No. JP-A 2007-067250,
Japanese Laid Open Patent Application No. 1993-343669, and
Japanese Laid Open Patent Application No. 1994-021089.

One issue in next generation semiconductor devices in which the gate length is reduced below the quarter micron order is production of minute particles during the gate electrode formation. Minute particles may work as etching masks and cause production of skirt-like etching residuals adjacent to the gate electrodes. The skirt-like etching residuals may be directly contacted to the cell contacts formed thereafter, causing short-circuiting between a bitline and a gate electrode or between a capacity electrode and the gate electrode. This may undesirably lower the production yield. It is also a problem that the defects resulting from the minute particles necessitate performing product screening for detecting initial defects with severe conditions.

The suppression of the above described phenomenon is of importance to achieve a high yield in a customer sub-constructor's production process and to maintain a high reliability in a market, especially in a case of the KGD (Known Good Die) business based on the SIP (System In Package) and the MCM (Multi Chip Module). One currently-used approach to address this problem is optimization of the etching conditions for reducing minute particles; however, further advance is desired to address the problem of minute particles, since the detection by an automatic defect detecting machine may face limitations with the further dimension reduction.

In the following, a detailed description is given of the problem of the minute particles, referring to FIGS. 1A to 1H. At first, isolation oxide films 102 are formed within the surface portion of a P-type silicon substrate 101 by using a trench isolation technique. A gate oxide film 103 is then formed in active regions isolated by the isolation oxide films 102. This is followed by sequentially depositing an $N^+$-doped silicon film 104, a tungsten silicide film 105, and a CVD oxide film 106 to cover the P-type silicon substrate 101 as shown in FIG. 1A.

The CVD oxide film 106 is then etched with a photoresist pattern used as a mask to form mask oxide films 107 as shown in FIG. 1B. Furthermore, cell gate electrodes 108 are formed by subsequently etching the tungsten silicide film 105 and the $N^+$-doped silicon film 104 with the mask oxide films 107 used as a mask. It should be noted that minute particles may be produced in the etching process of the $N^+$-doped silicon film 104, and the minute particles may work as a mask to locally produce residuals 109 from the $N^+$-doped silicon film 104.

This is followed by forming N-type diffusion layers 110 by an ion implantation technique with the cell gate electrodes 108 used as a mask as shown in FIG. 1C. After a first nitride film 111 is then formed to cover the entire surface, an interlayer dielectric 112 is formed and then flattened by a CMP (chemical mechanical polishing) technique, as shown in FIG. 1D. Subsequently, cell contact holes 113 are formed by etching the interlayer dielectric 112 with a photoresist pattern used as a mask and the first nitride film 111 used as a stopper, as shown in FIG. 1E. Furthermore, the first nitride film 111 is etched back to expose the P-type silicon substrate 101 in the cell contact holes 113. This process also results in the formation of sidewalls 114 from the first nitride film 111 on the side faces of the cell gate electrodes 108. At this moment, portions of the residuals 109 are exposed because of the difference in the etching rate between the first nitride film 111 and the residuals 109, which are formed of $N^+$-doped silicon, as shown in FIG. 1F.

This is followed by filling the cell contact holes 113 with $N^+$-doped silicon contacts 115 through depositing an $N^+$-doped silicon film on the entire surface and performing an etch-back process. This may result in forming a short-circuiting portion 116 which undesirably short-circuits a cell gate electrode 108 and an $N^+$-doped silicon contact 115, because the residuals 109 are partially exposed and the exposed portions directly contacts to the $N^+$-doped silicon contact 115 as shown in FIG. 1G. Subsequently, capacitor contacts 117, capacitor electrodes 118, capacitor dielectrics 119, and capacitor plates 120 are formed after forming an interlayer dielectric film. This is followed by forming bitline contacts 121 and bit lines 122 after forming another interlayer dielectric film so that the bit line contacts 121 are connected to the cell contacts 113. As a result, DRAM memory cells, which each include one transistor and one capacitor, are completely manufactured as shown in FIG. 1H.

The above-described manufacture process, however, suffers from a problem of short-circuiting between the bitlines 122 and the gate electrodes 108 and/or between the capacitor electrodes 118 and the cell gate electrodes 108, because the cell gate electrodes 108 may be electrically connected to the contacts (each composed of a capacitor contact 117 and a bitline contact 121) through the residuals 109, as described above.

SUMMARY

In an aspect of the present invention, a manufacture method of forming a semiconductor device includes: forming a plurality of gate electrodes through etching a conductive film deposited on a semiconductor substrate; forming a first nitride film to cover the gate electrodes; partially exposing the semiconductor substrate in a region between adjacent two of the gate electrodes through performing an etch-back process on the first nitride film; thermally oxidizing a residual of the gate electrode film remaining in the region between the adjacent two of the gate electrodes to change the residual into an thermal oxide film; and forming a contact in the region between the adjacent two of the gate electrodes.

In another aspect of the present invention, a semiconductor device includes: a gate electrode formed over a semiconductor substrate and covered with a sidewall; and a contact formed adjacent to the sidewall to provide a connection between a diffusion region of the semiconductor substrate and an interconnection provided above the gate electrode. The gate electrode and the contact are insulated by insulative material in at least a portion of the sidewall adjacent to a surface of the semiconductor substrate, and the insulative material is oxide of material of the gate electrode.

The present invention effectively avoids short-circuiting between a bitline and a cell gate electrode and/or short-circuiting between a capacitor electrode and a cell gate electrode.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1A:
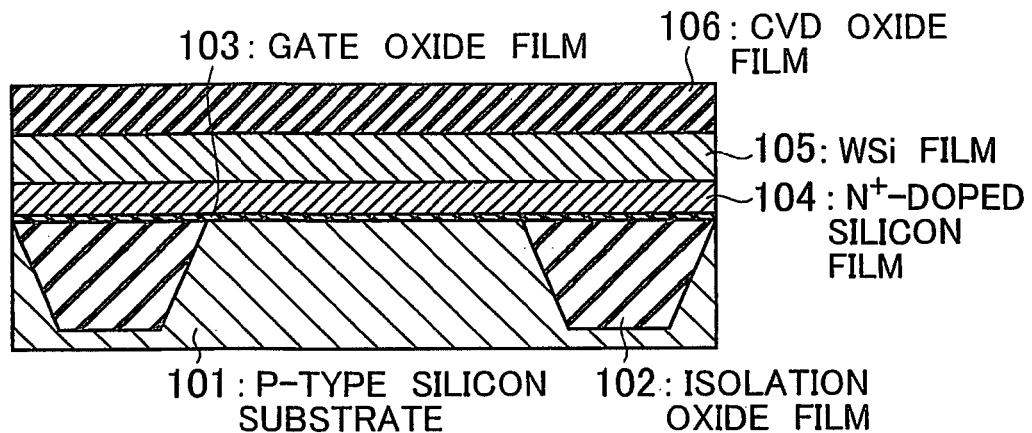
FIGS. 1A to 1H are section views showing a typical manufacture method of a semiconductor device illustrated for explaining problems to be solved by the present invention.
Figure 1B:
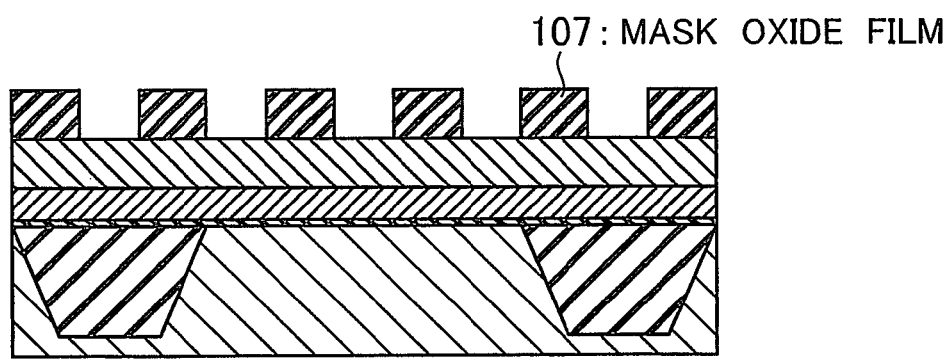
Figure 1C:
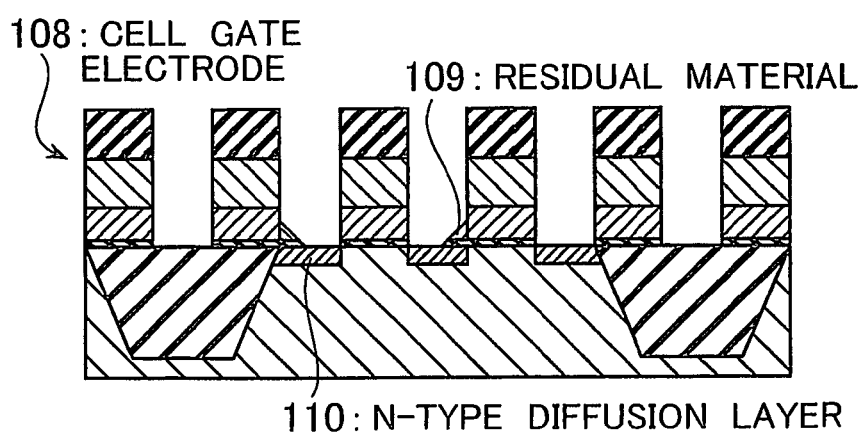
Figure 1D:
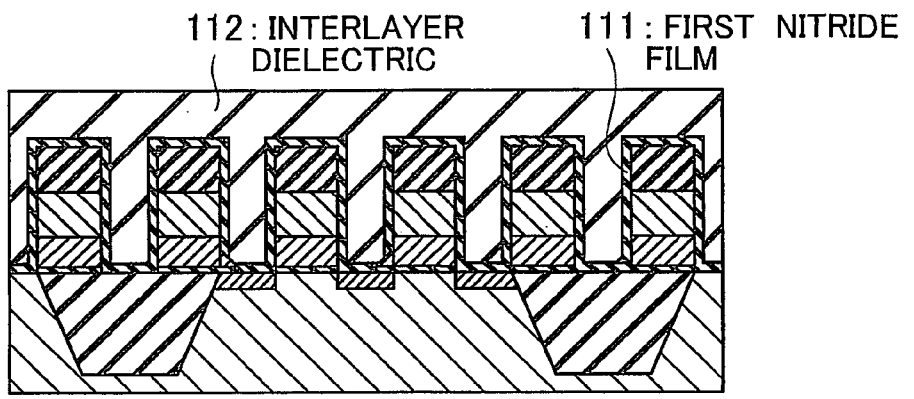
Figure 1E:
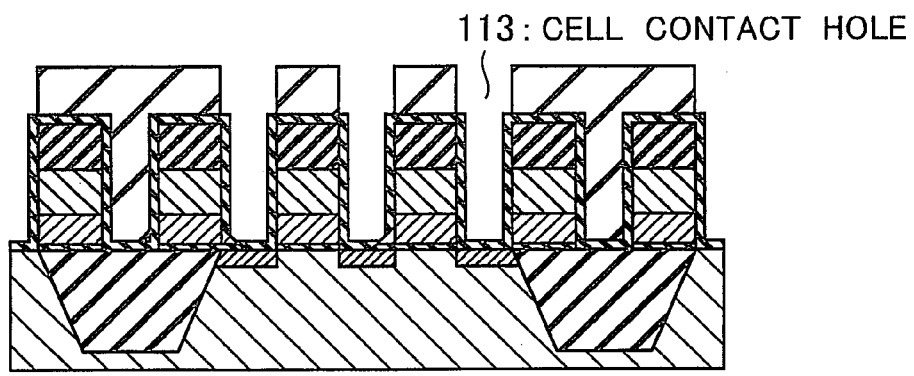
Figure 1F:
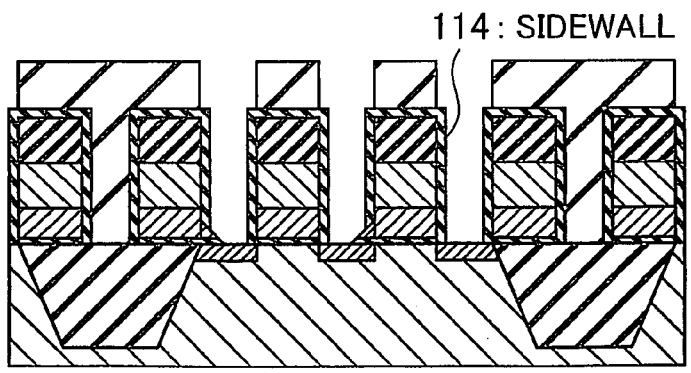
Figure 1G:
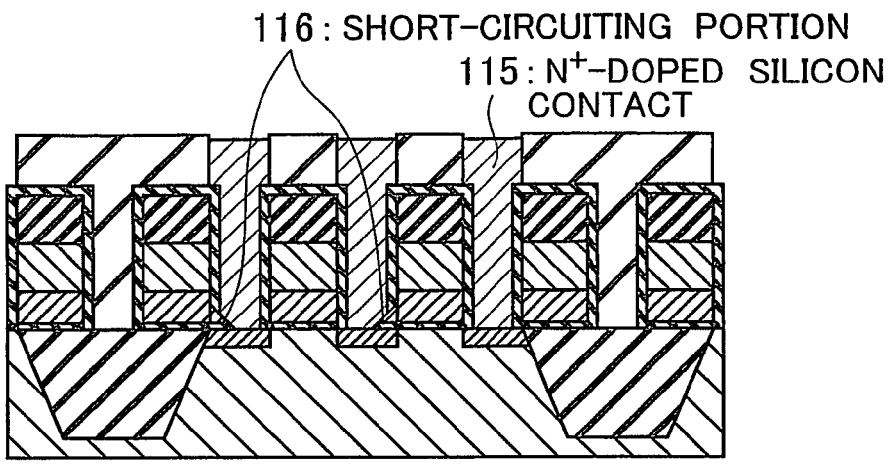
Figure 1H:
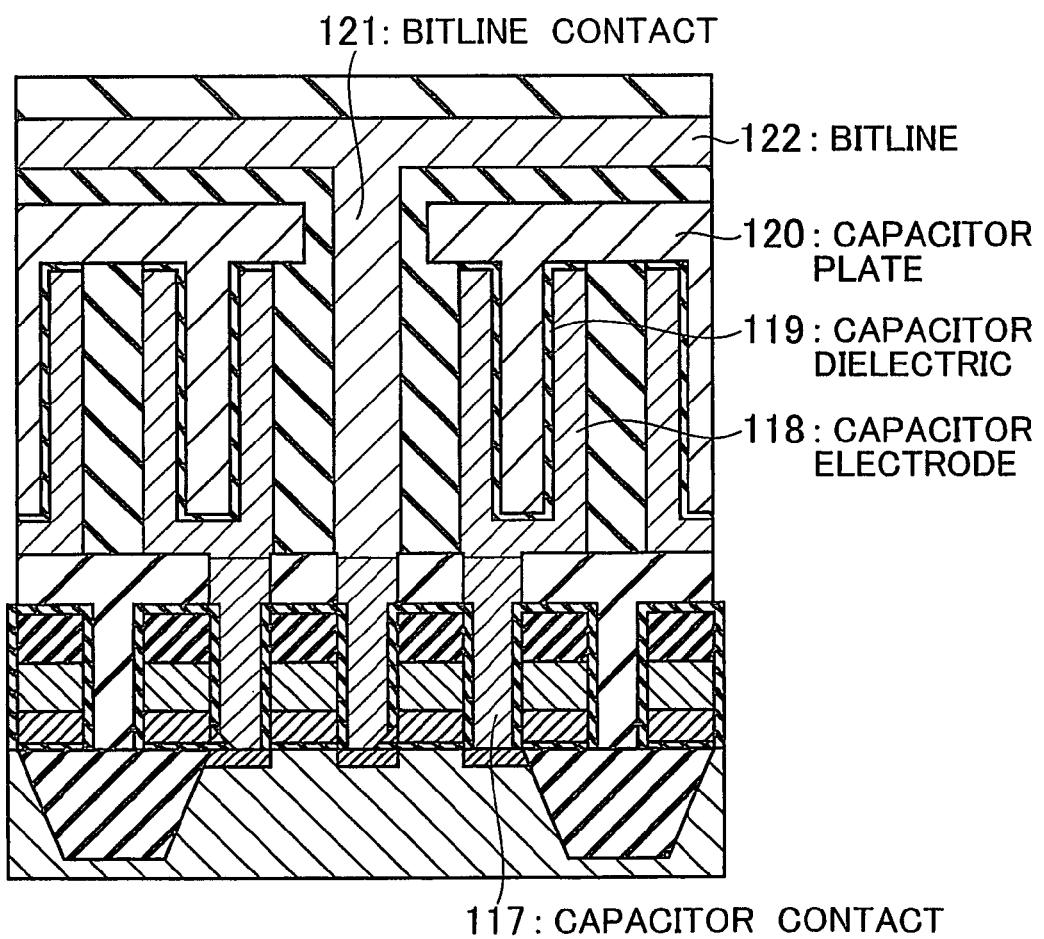
Figure 2A:
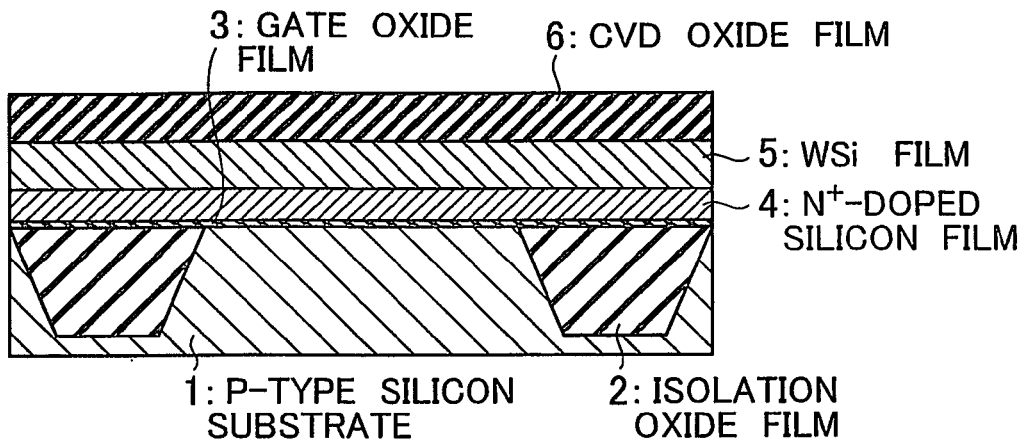
FIGS. 2A to 2K are section views showing a method for manufacturing a semiconductor device in a first embodiment of the present invention.

Referring to FIGS. 2A to 2K, a description is given below of an exemplary process of manufacturing a semiconductor device in a first embodiment of the present invention. The manufacture process of this embodiment begins with forming isolation oxide films 2 with a depth of 0.25 to 0.40 μm on the surface of a P-type silicon substrate 1 by using a trench isolation technique. Gate oxide films 3 are then formed with a thickness of 5 to 10 nm in respective active regions isolated by the isolation oxide films 2. This is followed by sequentially forming an N+-doped silicon film 4 with a thickness of 0.1 to 0.15 μm, a tungsten silicide film 5 with a thickness of 0.1 to 0.15 μm, and a CVD oxide film 6 with a thickness of 0.2 to 0.3 μm to cover the P-type silicon substrate 1, as shown in FIG. 2A.

Figure 2B:
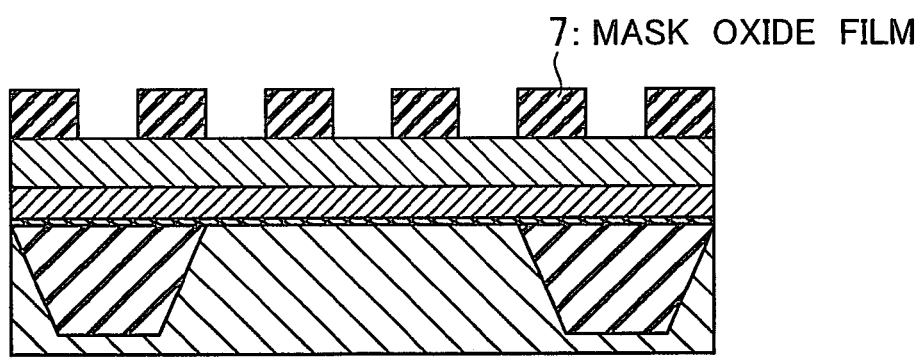

Subsequently, mask oxide films 7 with a width of 0.11 to 0.2 μm are formed by etching the CVD oxide film 6 with a photoresist pattern used as a mask, as shown in FIG. 2B. Furthermore, cell gate electrodes 8 of a polyside structure are formed by sequentially etching the tungsten silicide film 5 and the N+ doped silicon film 4 with the mask oxide films 7 used as a mask. It should be noted that this process suffers from a problem that minute particles of 0.05 to 0.15 μm produced in etching the $N^+$-doped silicon film 4 may work as a mask and locally produce residuals 9 formed of $N^+$-doped silicon.

Figure 2C:
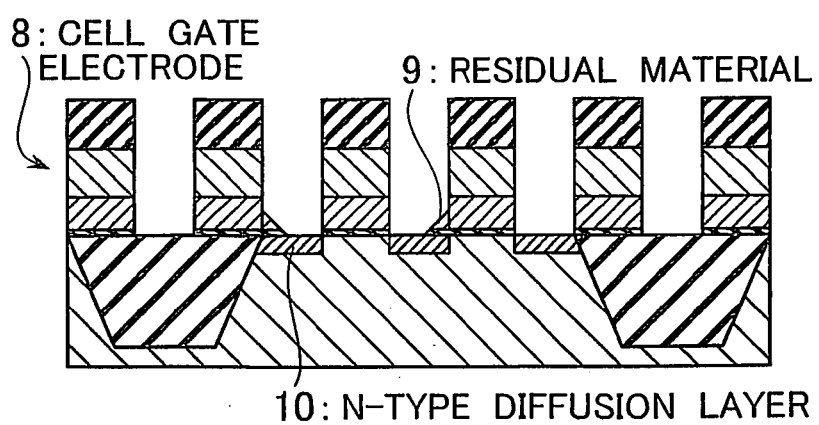
Figure 2D:
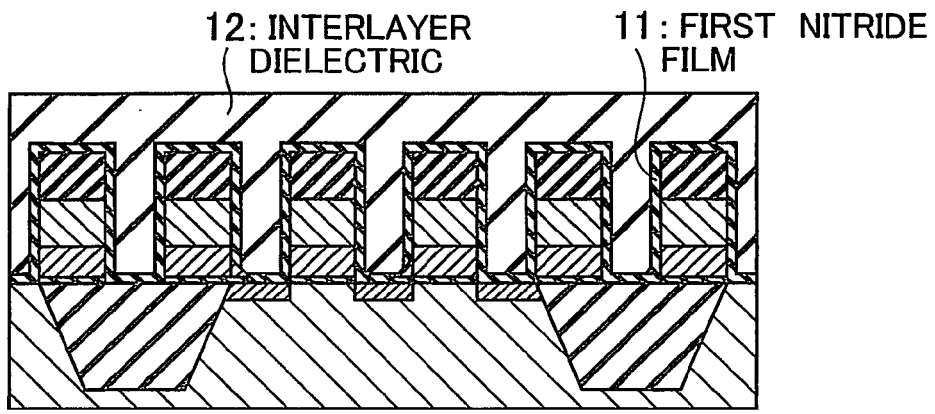
Figure 2E:
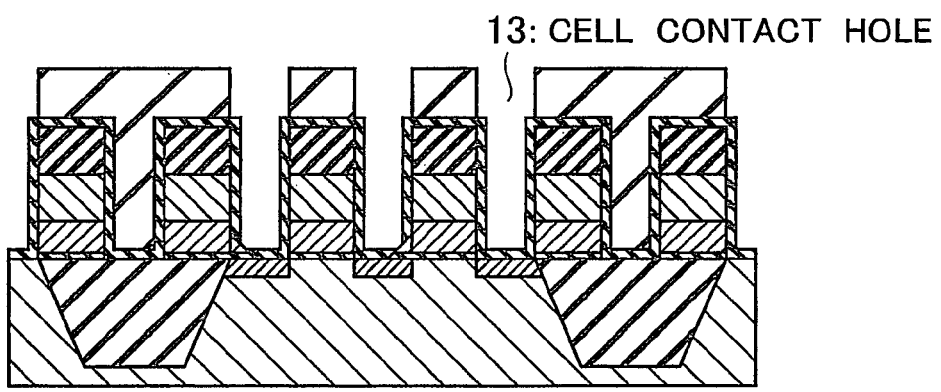
Figure 2F:
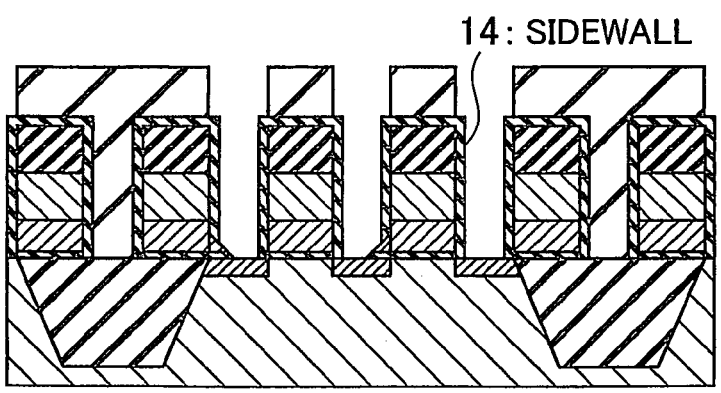

N-type diffusion layers 10 are then formed by using the cell gate electrodes 8 as a mask through ion implantation of arsenic, for example, with a concentration of $1 \times 10^{13}$ to $5 \times 10^{13}$ cm$^{-2}$, as shown in FIG. 2C. This is followed by forming a first nitride film 11 with a thickness of 0.05 to 0.1 μm to cover the entire structure, and then forming an interlayer dielectric 12 with the surface thereof flatten by a CMP technique as shown in FIG. 2D. Subsequently, cell contact holes 13 with an opening of 0.1 to 0.18 μm are formed by etching the interlayer dielectric 12 with a photoresist pattern used as a mask and with the first nitride film 11 used as a stopper, as shown in FIG. 2E. Furthermore, portions of the P-type silicon substrate 1 in the cell contacts holes 13 are exposed by etching back the first nitride film 11. In this process, sidewalls 14 with a thickness of 0.03 to 0.08 μm of the first nitride film are concurrently formed on the side faces of the cell gate electrodes 8. At this moment, portions of the residuals 9 are exposed because of the difference in the etching rate between the first nitride film 11 and the $N^+$-doped silicon film 4 caused by the high selectivity of the etching, as shown in FIG. 2F.

Figure 2G:
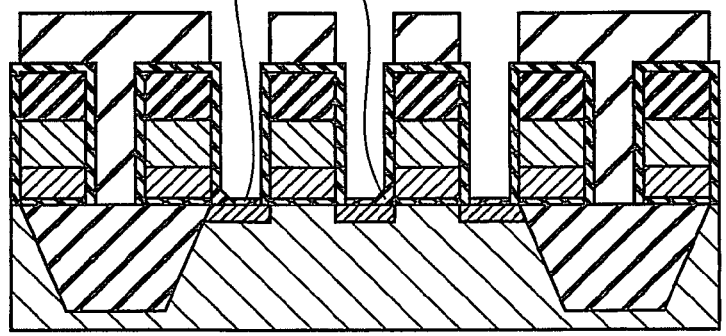

This is followed by forming a thermally-oxidized film 23 with a thickness of 10 to 25 nm through a thermal oxidization technique involving annealing in a dry air atmosphere in an electric furnace at a temperature of 85° C., for example. It should be noted that, in this process, the oxidization of the $N^+$-doped silicon residuals 9 is enhanced due to the electron concentration higher than that of the N-type diffusion layers 10, allowing transformation of almost the entire of the residuals 9 into oxidation-enhanced oxide films 24 as shown in FIG. 2G.

Figure 2H:
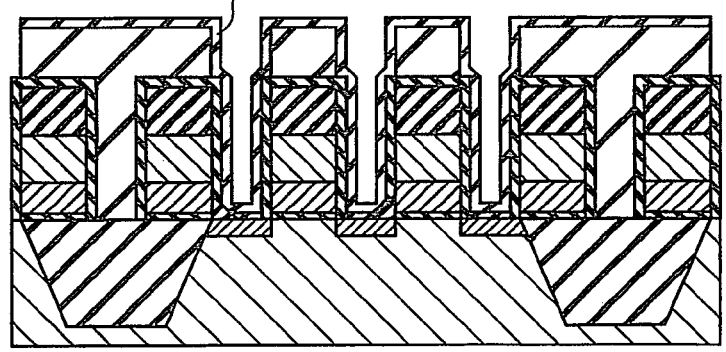
Figure 2I:
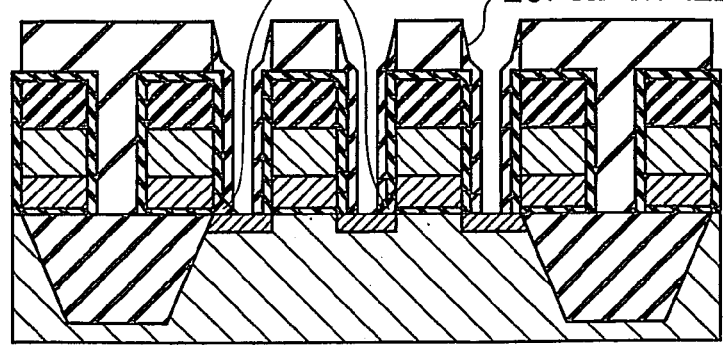
Figure 2J:
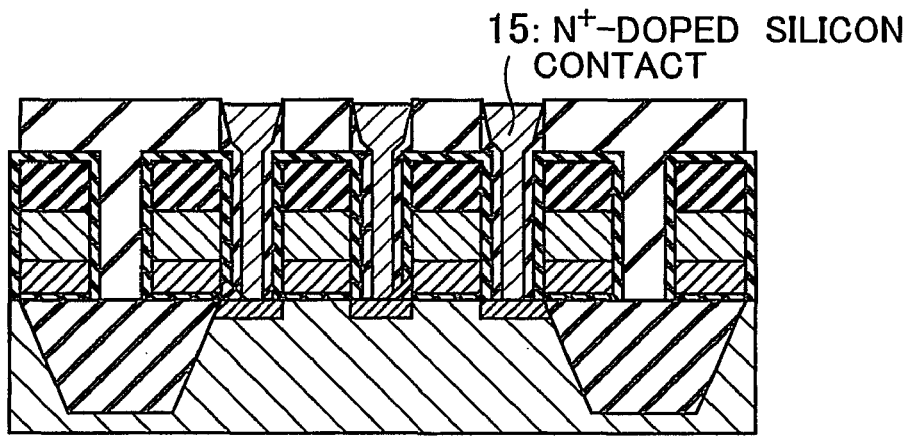

A second nitride film 25 with a thickness of 30 to 80 nm is then formed to cover the entire structure as shown in FIG. 2H. This is followed by partially exposing the P-type silicon substrate 1 by performing an etch-back process on the second nitride film 25. The etch-back process results in removing the tip portion of the oxidation-enhanced oxide films 24, forming cap oxide films 27 so as to cover the clearances between the sidewalls 26 formed from the second nitride film 25 and the P-type silicon substrate 1 as shown in FIG. 2I. This is followed by filling the cell contact holes 13 with $N^+$-doped silicon contacts 15 through depositing an $N^+$-doped silicon film covering the entire surface and then performing an etch-back process on the entire surface, as shown in FIG. 2J. Subsequently, capacitor contacts 17, capacitor electrodes 18, capacitor dielectric films 19, and capacity plates 20 are formed above the cell gate electrodes 8 after forming another interlayer dielectric. This is followed by forming bitlines 22 and bitline contacts 21 providing connections between the bitlines 22 and the $N^+$-doped silicon contacts 15 above the cell gate electrodes 8 after forming another interlayer dielectric.

Figure 2K:
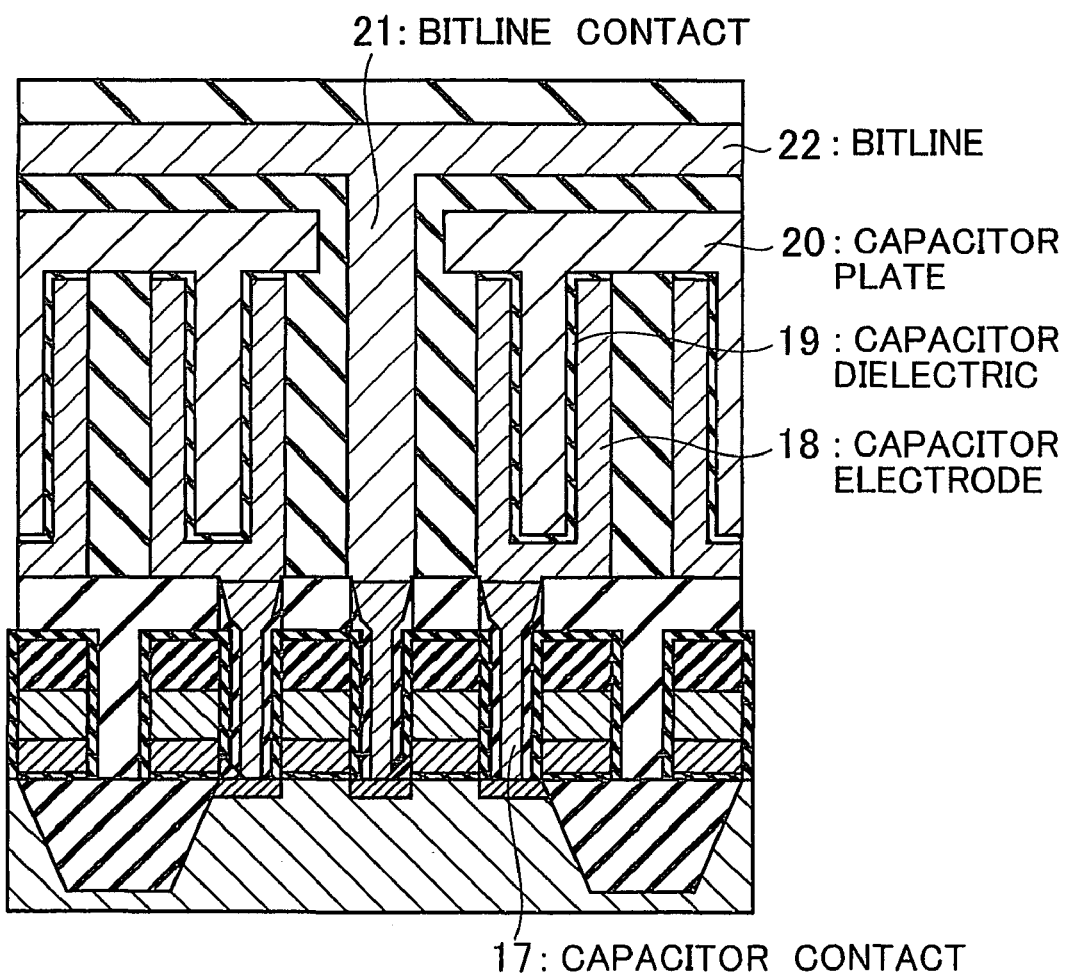

This completes the formation of DRAM memory cells, each including one transistor and one capacitor as shown in FIG. 2K.

As described above, the manufacture process of the first embodiment of the present invention allows transforming almost the entire of the residuals 9 formed of N⁺-doped silicon into the oxidation-enhanced oxide films 24 by the thermal oxidation after the formation of the cell contact holes 13, making use of the difference in the oxidization speed caused by the difference in the electron concentration between the N⁺-doped silicon film 4 and the P-type silicon substrate 1. In addition, the formation of the sidewalls 26 from the second nitride film 25 which cover the oxidation-enhanced oxide films 24 allows electrically isolating the N⁺-doped silicon contacts 15 and the cell gate electrodes 8 from each other with the sidewalls 26 and the cap oxide films 27. Specifically, the cell gate electrodes 8 and the N⁺-doped silicon contacts 15 are insulated by the cap oxide films 27, which are formed of oxide of material used for the cell gate electrodes 8, at the base region where the sidewalls 26 are in contact with the surface of the P-type silicon substrate 1. This effectively avoids the short-circuiting between the bitlines 22 and the cell gate electrodes 8 and/or between the capacitor electrodes 18 and the cell gate electrodes 8.

Second Embodiment

A description is then given of an exemplary process of manufacturing a semiconductor device in a second embodiment of the present invention, referring to FIGS. 3A to 3K. The first embodiment is directed to provide a solution to the problem that the local residuals 9 formed of N⁺-doped silicon due to the formation of the minute particles of 0.05 to 0.15 μm working as a mask in the etching process of the N⁺-doped silicon film 4.

On the other hand, the second embodiment is directed to avoid a problem caused by minute particles of 0.05 to 0.15 μm produced in etching the CVD oxide film 6 with a photoresist pattern used as a mask.

Figure 3A:
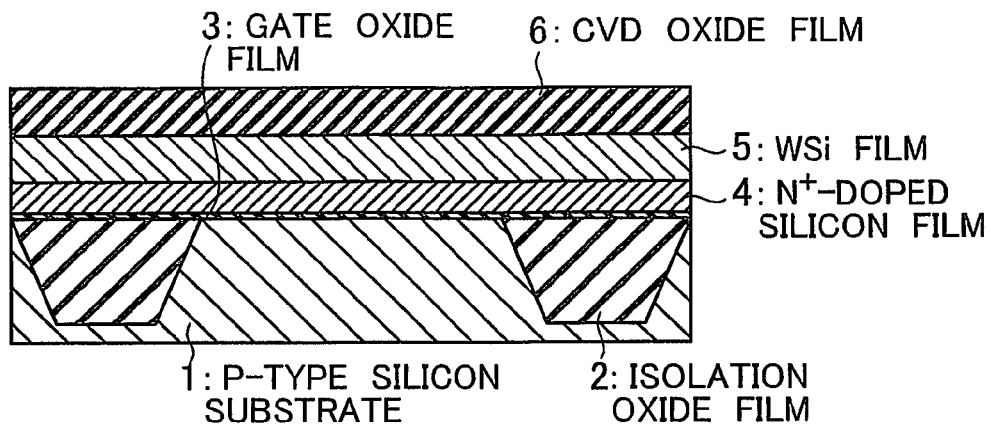
FIGS. 3A to 3K are section views showing a method for manufacturing a semiconductor device in a second embodiment of the present invention.
Figure 3B:
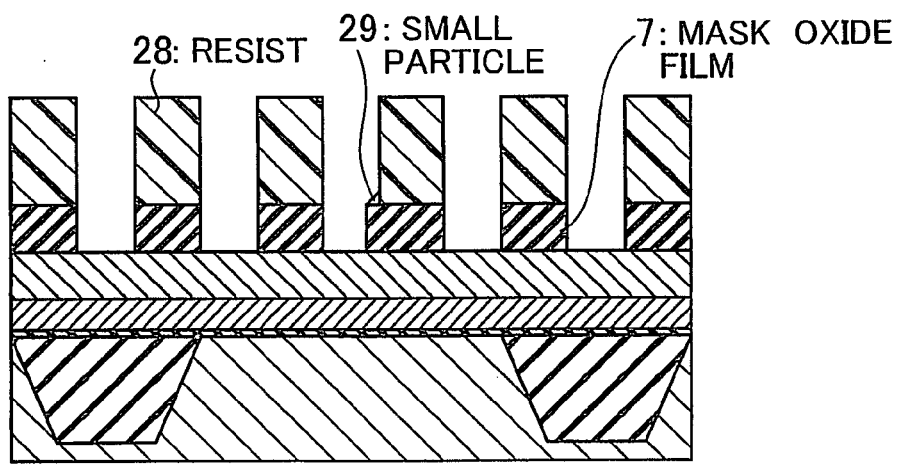

As shown in FIG. 3A, the process of the second embodiment begins with forming the isolation oxide films 2, the gate oxide films 3, the N⁺-doped silicon film 4, the tungsten silicide film 5, and the CVD oxide film 6 in the same manner as that of the first embodiment. This is followed by forming the mask oxide films 7 by etching the CVD oxide film 6 with a photoresist pattern used as a mask. In this etching, some of the mask oxide films 7 (the third mask oxide film 7 from the right in FIG. 3B) are sometimes formed with dimensions larger than the design dimensions due to the minute particles 29 as shown in FIG. 3B.

Figure 3C:
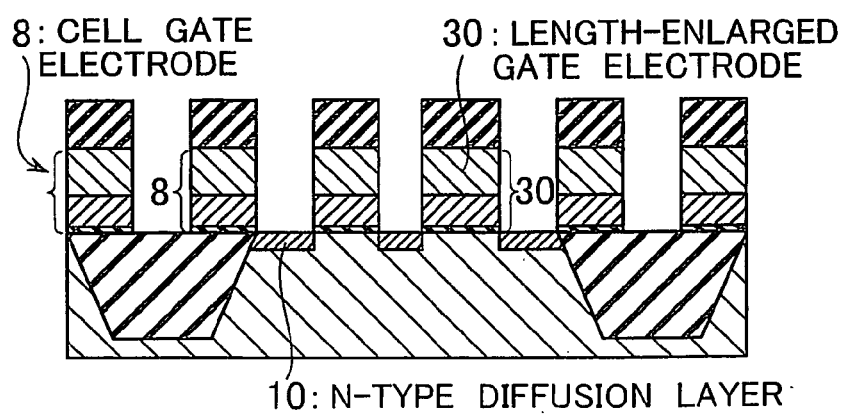

The cell gate electrodes 8 are then formed by sequentially etching the tungsten silicide film 5 and the N⁺-doped silicon film 4 with the mask oxide films 7 used as a mask. This may result in forming a length-enlarged cell gate electrode 30 having a length longer than a desired length at a portion where the dimension of a certain mask oxide film 7 is larger than the design dimension. This implies that there is a need for preventing short-circuiting between the length-enlarged cell gate electrode 30 and an adjacent N⁺-doped silicon contact 15 as shown in FIG. 3C.

Figure 3D:
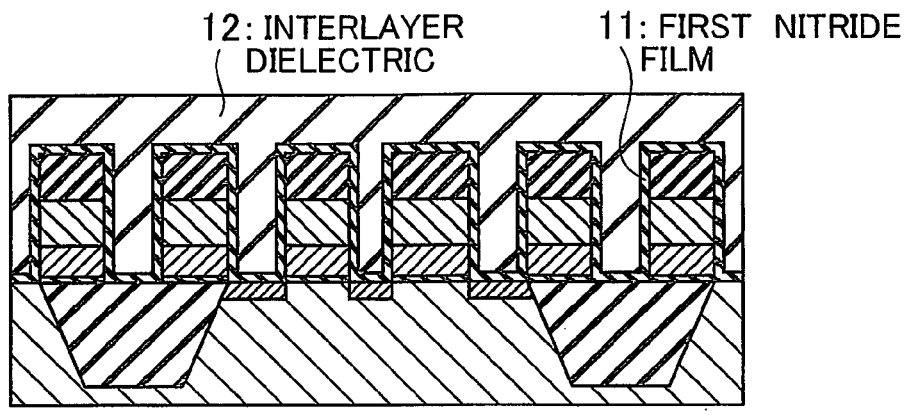
Figure 3E:
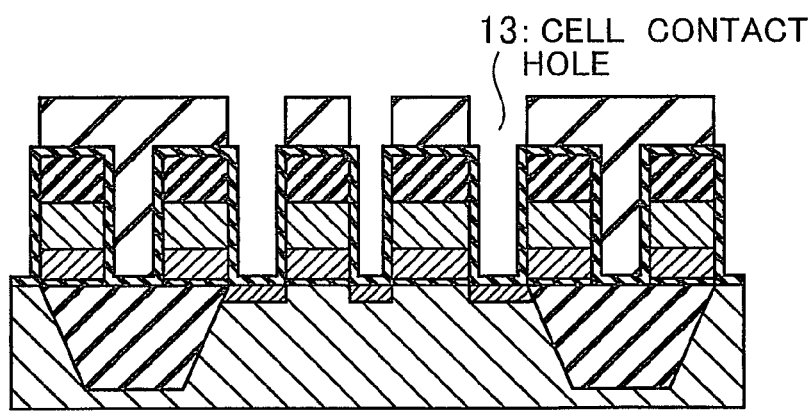

After forming the first nitride film 11 to cover the entire structure, the interlayer dielectric 12 is formed and the surface thereof is then flatten by a CMP technique as shown in FIG. 3D. This is followed by forming the cell contact holes 13 by etching the interlayer dielectric 12 with a photoresist pattern used as a mask and with the first nitride film 11 used as a stopper as shown in FIG. 3E.

Figure 3F:
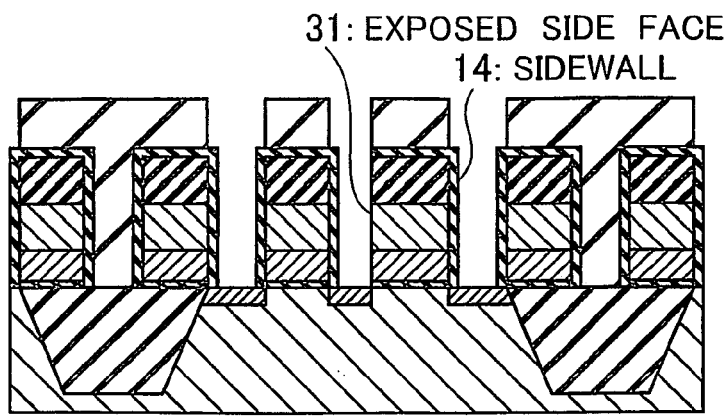

One issue in forming the cell contact holes 13 so that the cell contact holes 13 are self-aligned to the cell gate electrodes 8 is that the sidewalls 14, which are formed from the first nitride film 11, sometimes have an insufficient thickness due to the increased length of the length-enlarged cell gate electrode 30 in the process for etching the interlayer dielectric 12 to expose the P type silicon substrate 1. In this case, the side face 31 of the length-enlarged cell gate electrode 30 is exposed, as shown in FIG. 3F.

Figure 3G:
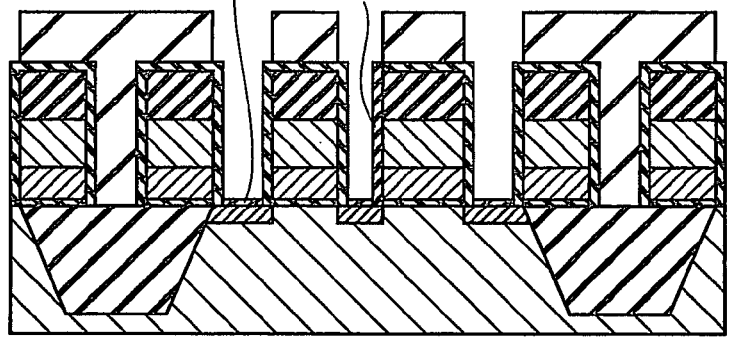
Figure 3H:
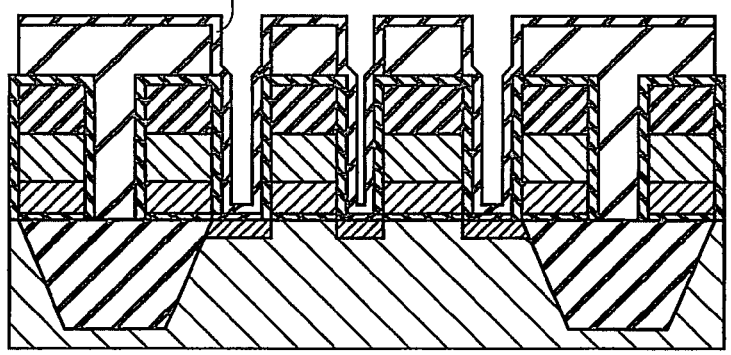
Figure 3I:
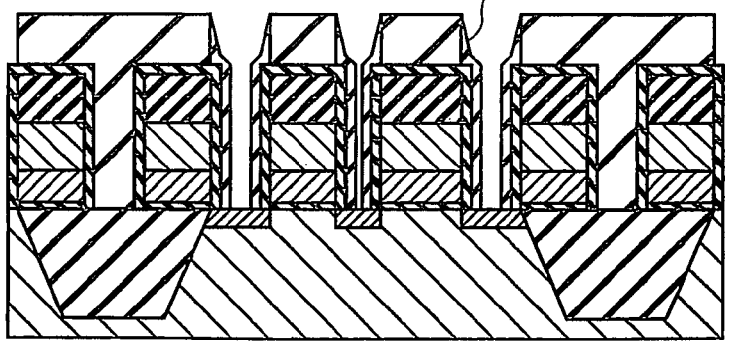

A thermal oxidation is then performed, and this thermal oxidization allows changing the exposed portion of the length-enlarged cell gate electrode 30 into a side oxide film 32 while forming the thermal oxide film 23 on the P-type silicon substrate 11, as shown in FIG. 3G. A second nitride film 25 is then formed to cover the entire structure as shown in FIG. 3H, and this is followed by performing an etch-back process to partially expose the P-type silicon substrate 1. This results in forming the sidewalls 26. The sidewalls 26, which are formed to cover the side oxide film 32, provides a double insulation structure as shown in FIG. 3I.

Figure 3J:
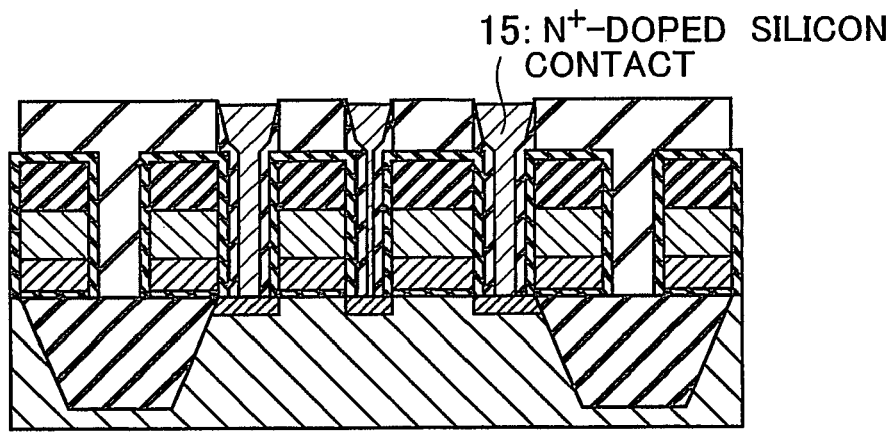
Figure 3K:
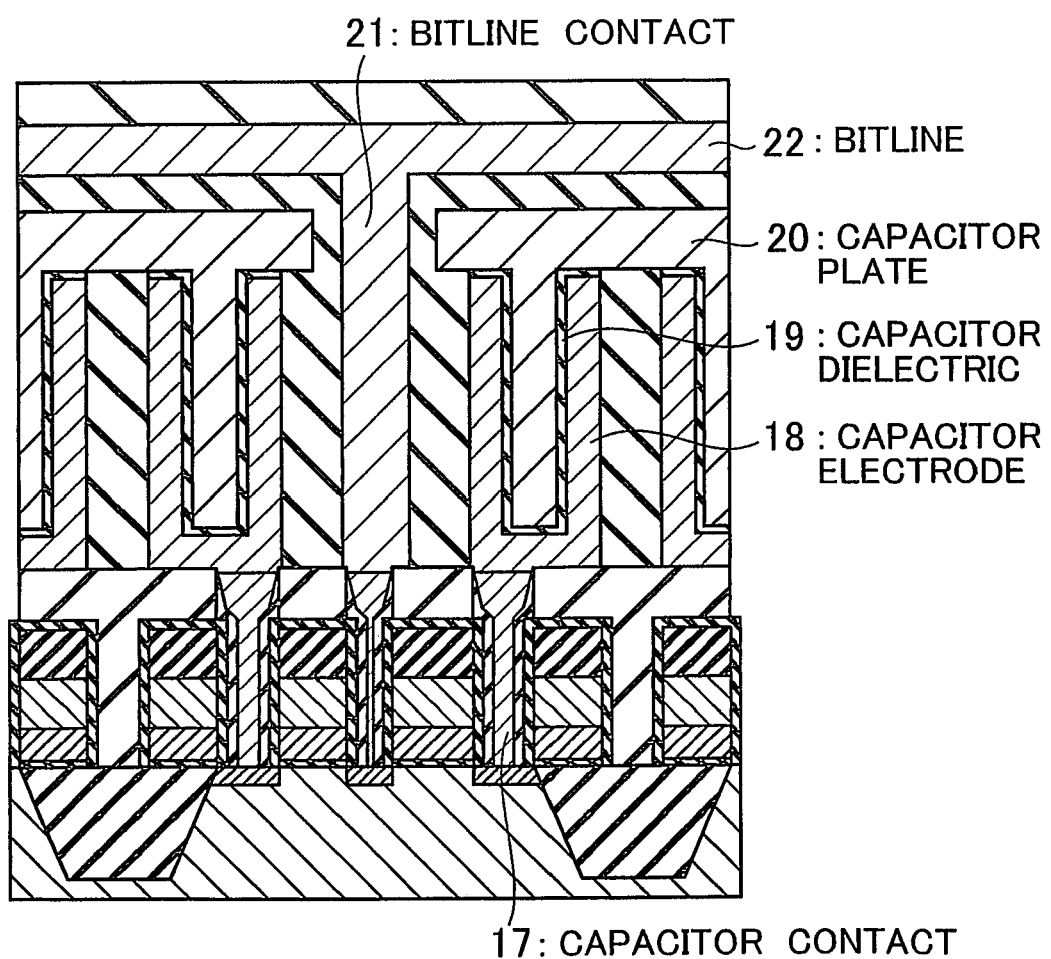

Finally, the cell contact holes 13 are filled with the N⁺-doped silicon contacts 15 as shown in FIG. 3J, and thus the semiconductor device similar to that of the first embodiment is manufactured as shown in FIG. 3K.

The manufacture process of this embodiment provides secure insulation between the N⁺-doped silicon contacts 15 and the cell gate electrodes 8 with the sidewalls 26 formed from the second nitride film 25 and the side oxide film 32 formed from a portion of the length-enlarged cell gate electrode 30, even when the length-enlarged cell gate electrode 30 is formed. This effectively avoids short-circuiting between the bitlines 22 and the cell gate electrodes 8 and/or between the capacitor electrodes 18 and the cell gate electrodes 8. The manufacture process of the second embodiment, which involves the above described thermal oxidization process, provides advantages similar to those of the first embodiment.

It is apparent that the present invention is not limited to the above embodiments, but may be modified and changed without departing from the scope of the invention.

What is claimed is:

1. A semiconductor device comprising:
   a gate electrode film formed over a semiconductor substrate and covered with a sidewall; and
   a contact formed adjacent to said sidewall to provide a connection between a diffusion region of said semiconductor substrate and an interconnection provided above said gate electrode film,
   wherein said gate electrode film and said contact are insulated by an insulative film in at least a portion of said sidewall adjacent to a surface of said semiconductor substrate,
   wherein said insulative film comprises an oxide of said gate electrode film, and
   wherein said insulative film comprises an oxidation-enhanced oxide film.

2. The semiconductor device according to claim 1, wherein a portion of said sidewall located above said insulative film comprises a nitride film.

3. The semiconductor device according to claim 1, wherein said insulative film reaches a top end of said gate electrode film to form said sidewall.

4. The semiconductor device according to claim 1, further comprising an additional sidewall covering said insulative film and said sidewall.

5. The semiconductor device according to claim 1, wherein said additional sidewall comprises a nitride film.

6. The semiconductor device according to claim 1, wherein said insulative film is disposed at a region where said sidewall contacts said semiconductor substrate.

7. The semiconductor device according to claim 1, wherein said oxidation-enhanced oxide film is formed by oxidation of $N^+$-doped silicon residuals.

8. A device comprising:
 a gate electrode formed over a semiconductor substrate;
 a contact formed adjacent to said gate electrode; and
 a sidewall disposed between the gate electrode and the contact, said sidewall comprising:
  a first portion adjacent to a surface of said semiconductor substrate, the first portion comprising an oxide of said gate electrode; and
  a second portion, disposed above the first portion, comprising a nitride film,
 wherein said first portion comprises an oxidation-enhanced oxide film.

9. The device according to claim 8, further comprising an additional sidewall covering said sidewall.

10. The device according to claim 9, wherein said additional sidewall comprises a nitride film.

11. The device according to claim 8, wherein said oxidation-enhanced oxide film is formed by oxidation of $N^+$-doped silicon residuals.

* * * * *